(12) United States Patent
Shukla et al.

(10) Patent No.: US 10,269,735 B1
(45) Date of Patent: Apr. 23, 2019

(54) IC STRUCTURE WITH ADJUSTABLE INDUCTANCE AND CAPACITANCE AND RELATED METHOD

(71) Applicant: GLOBALFOUNDRIES INC., Grand Cayman (KY)

(72) Inventors: Umesh Kumar Shukla, Bengaluru (IN); Sandeep Torgal, Bengaluru (IN); Venkata N. R. Vanukuru, Bengaluru (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/009,329

(22) Filed: Jun. 15, 2018

(51) Int. Cl.
| | |
|---|---|
| H01L 25/00 | (2006.01) |
| H01L 23/66 | (2006.01) |
| H01L 49/02 | (2006.01) |
| H01L 23/528 | (2006.01) |
| H01L 23/522 | (2006.01) |
| H01L 27/06 | (2006.01) |
| H01L 27/02 | (2006.01) |
| H03H 11/28 | (2006.01) |
| H03H 11/04 | (2006.01) |
| G01R 31/28 | (2006.01) |

(52) U.S. Cl.
CPC .......... *H01L 23/66* (2013.01); *G01R 31/2884* (2013.01); *H01L 23/528* (2013.01); *H01L 23/5223* (2013.01); *H01L 23/5227* (2013.01); *H01L 23/5228* (2013.01); *H01L 27/0255* (2013.01); *H01L 27/0629* (2013.01); *H01L 27/0647* (2013.01); *H01L 28/10* (2013.01); *H01L 28/20* (2013.01); *H01L 28/40* (2013.01); *H03H 11/04* (2013.01); *H03H 11/28* (2013.01); *H01L 2223/6661* (2013.01); *H03H 2210/025* (2013.01); *H03H 2210/026* (2013.01); *H03H 2210/036* (2013.01)

(58) Field of Classification Search
None
See application file for complete search history.

(56) References Cited

U.S. PATENT DOCUMENTS

| | | | |
|---|---|---|---|
| 7,265,433 B2 * | 9/2007 | Pillai | H01L 24/05 257/531 |
| 2008/0123771 A1 | 5/2008 | Cranford et al. | |
| 2012/0188671 A1 | 7/2012 | Kireev et al. | |
| 2014/0176242 A1 | 6/2014 | Lin | |
| 2016/0182037 A1 | 6/2016 | Srihari et al. | |
| 2018/0294682 A1 * | 10/2018 | Qiu | H02J 50/70 |

* cited by examiner

*Primary Examiner* — Long Nguyen
(74) *Attorney, Agent, or Firm* — David Cain; Hoffman Warnick LLC

(57) ABSTRACT

Embodiments of the present disclosure provide an integrated circuit (IC) structure including: a first conductive layer of a device structure; a second conductive layer of the device structure vertically separated from the first conductive layer, wherein a load resistor couples the second conductive layer to ground; a t-coil having a first end coupled to the first conductive layer, and a second end coupled to the second conductive layer; and a variable capacitor having a first end coupled to the first conductive layer, and a second end coupled to the second conductive layer, the variable capacitor having an adjustable capacitance.

20 Claims, 9 Drawing Sheets

IC STRUCTURE WITH ADJUSTABLE INDUCTANCE AND CAPACITANCE AND RELATED METHOD

TECHNICAL FIELD

Embodiments of the disclosure relate generally to integrated circuit (IC) structures configured to compensate for other device characteristics, e.g., parasitic capacitance in a signal processing circuit, along with related methods. Embodiments of the structures may include a set of adjustable components to compensate for parasitic capacitance while providing additional structural features.

BACKGROUND

The use of multiple interconnected devices over a wide area, colloquially known as "internet of things" or "IOT," is a rapidly growing area of electronics engineering. Each interconnected device in an IOT arrangement can include one or more radio frequency (RF) components to provide signal transmission and reception with respect to other devices in the same network. The sheer number of interconnected devices in such arrangements has accompanied significant increases in the signal processing burden on electronic systems. The ever-increasing density of features in a device may impose additional technical constraints, e.g., parasitic capacitance. Parasitic capacitance refers to a technical phenomenon in which two conductive devices in close proximity to each other exhibit electrical capacitance despite being electrically separate.

A circuit designer may introduce additional components to reduce or eliminate adverse effects of parasitic capacitance. As noted above, there are limited options for changing the circuit structure because of the increasing component density and decreasing size of interconnected devices. Conventional circuit structures for counteracting parasitic capacitance or other constraints may have a high circuit area and manufacturing cost. Other technical concerns, e.g., connecting to electrostatic discharge nodes may further limit the flexibility of existing technical solutions. Introducing other device elements may also have the unintended consequence of creating other sources of signal interference (e.g., cross-talk) by way of being close to other components.

SUMMARY

A first aspect of the present disclosure provides an integrated circuit (IC) structure having: a first conductive layer of a device structure; a second conductive layer of the device structure vertically separated from the first conductive layer, wherein a load resistor couples the second conductive layer to ground; a t-coil having a first end coupled to the first conductive layer, and a second end coupled to the second conductive layer; and a variable capacitor having a first end coupled to the first conductive layer, and a second end coupled to the second conductive layer, the variable capacitor having an adjustable capacitance.

A second aspect of the present disclosure provides an integrated circuit (IC) structure having: a first conductive layer of a device structure coupled to a transmission line; a second conductive layer of the device structure separate from the first conductive layer, wherein a load resistor couples the second conductive layer to ground; a parasitic capacitance coupled between the first conductive layer and the second conductive layer; a t-coil having a first end coupled to the first conductive layer, and a second end coupled to the second conductive layer, the t-coil including a plurality of turns each having an inner horizontal perimeter; and a variable capacitor having a first end coupled to the first conductive layer, and a second end coupled to the second conductive layer through a variable resistor, the variable capacitor having an adjustable capacitance, wherein the variable capacitor is positioned entirely within the inner horizontal perimeter of one of the plurality of turns of the t-coil.

A third aspect of the present disclosure provides a method including: providing an integrated circuit (IC) structure having: a first conductive layer of a device structure, a second conductive layer of the device structure vertically separated from the first conductive layer, wherein a load resistor couples the second conductive layer to ground, a t-coil having a first end coupled to the first conductive layer, and a second end coupled to the second conductive layer, and a variable capacitor having a first end coupled to the first conductive layer, and a second end coupled to the second conductive layer through a variable resistor, the variable capacitor having an adjustable capacitance, wherein the variable capacitor is electrically coupled in parallel with the t-coil between the input and output nodes, and wherein the t-coil and the variable capacitor are each positioned between the first and second conductive layers of the IC; measuring a return loss (RL) and bandwidth (BW) of the IC structure by transmitting a test signal from the input node to the output node, the t-coil having a test inductance and the variable capacitor having a test capacitance for the test signal; in response to the RL and BW meeting a tolerance threshold of the IC structure, reducing the test inductance of the t-coil and increasing the test capacitance of the variable capacitor by a predetermined amount; and in response to the RL and BW violating the tolerance threshold of the IC structure, maintaining the test inductance of the t-coil and the test capacitance of the variable capacitor.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
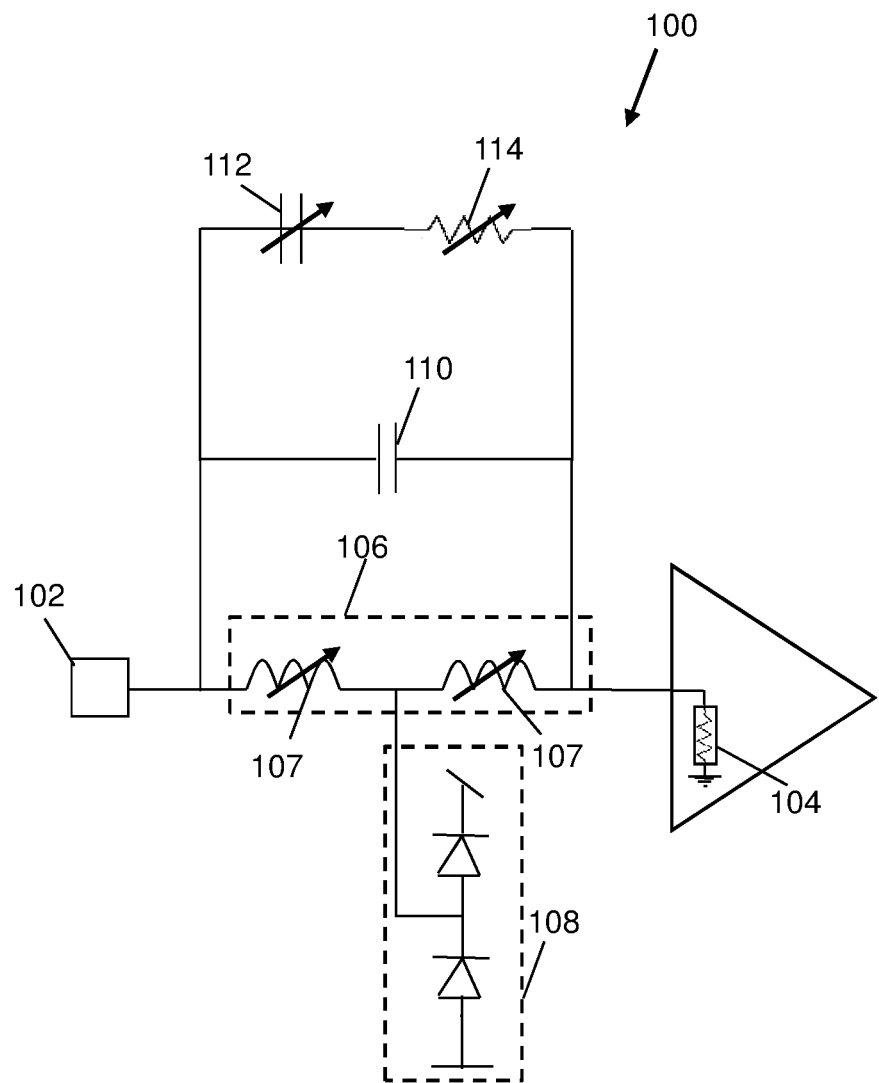
FIG. 1 shows a schematic view of an IC structure with a parasitic capacitance, t-coil, and variable capacitor according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Referring to FIG. 1, a schematic diagram of an integrated circuit (IC) structure (simply "structure" hereafter) 100 is shown according to embodiments of the disclosure. The schematic depiction of structure 100 is shown to demonstrate operational features of the present disclosure. Other portions of the disclosure, e.g., those provided in connection with FIGS. 2-5, provide structural details for implementing embodiments of structure 100 according to various examples. Structure 100 may be configured to remove various sources electrical interference from a signal to be transmitted. Conventional circuit structures may transmit signals which include various forms of interference, e.g., noise or other characteristics, which reduce the accuracy of signal transmission or reception. Such electrical interference may originate from portions of a circuit which generate a parasitic capacitance, e.g., two metal wires in close proximity with each other and separated by a small amount of dielectric material. It may not be possible or practical to adjust, reconfigure, or redesign a device to eliminate parasitic capacitances in every location, and thus embodiments of structure 100 may be used instead to compensate for parasitic capacitance or similar phenomena. Structure 100 in particular may introduce inductive and capacitive components to counteract any parasitic capacitances that would otherwise affect the accuracy of signal processing.

Structure 100 includes opposing terminals defined by an input node 102 electrically coupled to an output node 104. According to an example embodiment, input node 102 may include a test pad, transmission line, or similar structure for providing a signal to an electronic circuit, while output node 104 may include or take the form of a load resistor for driving the operation of a device or portion thereof. The load resistor of output node 104 may be positioned within a front end of line (FEOL) layer of a device, or within a back end of line (BEOL) layer of the same device. During operation, electrical signals transmitted through structure 100 may pass from input node 102 to output node 104 through components positioned electrically between input and output nodes 102, 104.

Structure 100 may include a telecoil ("t-coil") 106 positioned between input and output nodes 102, 104. T-coil 106 may refer to any currently known or later developed t-coil component configured for use in an electrical device, and the term "t-coil" as used herein should also be interpreted as referring to any three-terminal inductive component electrically coupled to an input node, output node, and discharge node. T-coil 106 thus may include without limitation other alternative electrical structures having the same arrangement of input, output, and discharge nodes, e.g., pi-coils and/or other currently known or later developed structures. In an embodiment, t-coil 106 may include a coiled wire for producing an electromagnetic field and filtering noise from a signal to be transmitted. T-coil 106 may be configured for use as part of a transmission line, e.g., for relaying electrical signals between two locations on a device structure.

T-coil 106 takes the form of a three-terminal component coupled between input and output nodes 102, 104. T-coil 106 may include two variable inductors 107 joined in series at a shared node. The shared node of t-coil 106 is coupled to an electrostatic discharge diode (ESD) 108 at a node between the variable inductors 107 of t-coil 106. ESD 108 may dissipate electrical energy in the structure 100 in the event of a power surge. According to an example, ESD 108 may include a Zener diode or other conventional electrical discharge element to protect other portions of structure 100 from electrostatic discharge and/or overvoltage in other scenarios.

The presence of ESD 108 in structure 100 may impose an electrical impedance on signals transmitted therethrough. This may pose difficulty in the process of "impedance matching," i.e., designing a circuit such that it will match the characteristics of a model after manufacture. ESD 108 may create a parasitic load between nodes 102, 104 and thus change the electrical behavior of structure 100 from its anticipated characteristics. For example, having a particular load resistance at output node 104 (e.g., fifty Ohms) may be observed as a different impedance in the complex domain when input node 102 is coupled to a signal transmission line. The presence of parasitic capacitance 110 (discussed in further detail herein) in particular may introduce a complex impedance term during the operation of structure 100, and thereby affect signal fidelity as measured through return loss (RL), bandwidth (BW), etc. That is, parasitic capacitance 110 will affect the signal phase and amplitude during operation (i.e., by introducing an "imaginary part" of impedance in the complex domain). Conventional t-coils may be configured to counteract such impedances, but the high amounts of surface area typically needed for a conventional t-coil component may introduce inefficiencies in the device structure. Structure 100 with t-coil 106 may be designed to eliminate the impedance cause by ESD 108 and/or other elements, allowing a user to compensate for changes in impedance while minimizing the total surface area of t-coil 106 within structure 100.

Portions of t-coil 106 function as inductors during operation, and an overview of inductor characteristics is provided for clarity. An inductor, sometimes known as a "coil" or "choke" is a two-terminal electrical element that converts electrical energy into magnetic energy by being physically structured to create a magnetic field. Such magnetic fields may be measured using Faraday's law of induction. During steady-state operation of a circuit, inductors may act substantially as non-resistive wires. During transient operation, however, an inductor will oppose any changes in current therein and impede transitions in current flow between its two terminals. Two inductors electrically coupled to each other in series will be functionally equivalent to a single inductor. The equivalent inductance (measured, e.g., in Henrys (H)) will be the sum of each inductance of the serially-connected inductors. During operation, t-coil 106 may be modeled as including two variable inductors 107 electrically coupled to ESD 108 at a common node, and in parallel with a parasitic capacitance 110 as discussed herein.

The presence of ESD 108 and/or other portions of t-coil 106 may create a parasitic capacitance 110 in structure 100. Parasitic capacitance 110 is shown to be coupled in parallel to the elements of t-coil 106 to represent the parasitic capacitive properties of t-coil 106. Parasitic capacitances may occur when two or more conductive elements are positioned in close proximity to each other, but separated by an insulative or dielectric material capable of storing charge between oppositely-charged conductive structures. Parasitic capacitance 110 is not intended to appear in the design of a circuit, yet may appear as a result of two or more electrical elements being in close proximity to each other and thus exhibiting some amount of capacitance. Parasitic capacitance 110 may impede the operation of other signal-transmission elements connected to the load resistance of output node 104. A capacitor is defined as a two-terminal electrical element which stores electrical potential in an electric field. Typically, such fields are formed by providing two oppositely-charged plates (arranged, e.g., in parallel with each other) separated by a relatively small electrically insulative region, e.g., air or more commonly a dielectric material. During transient operation, electric charge will gradually accumulate within a capacitor until the plates of the capacitor reach their full capacity at steady-state electrical operation. Multiple capacitors connected with each other in parallel may exhibit a total capacitance (measured, e.g., in Farads (F)) that is equal to the sum of each capacitor in the parallel arrangement. Parasitic capacitance 110 may represent the equivalent parasitic capacitance of all circuit features appearing between input and output nodes 102, 104.

As noted above, t-coil 106 opposes the transient buildup of electric current between nodes 102, 104, but also create parasitic capacitance(s) 110 between nodes 102, 104. In conventional settings, t-coil 106 will take up significant space on the surface area of a product to form the loops, coils, or other physical features required to generate the requisite magnetic field and accompanying inductance. T-coil 106 may differ from conventional circuits for counteracting a parasitic capacitance by having an adjustable (and thus user-defined) amount of inductance. As will be discussed in further detail herein, adjustable transistors and/or other elements for allowing or prohibiting current to flow into inductor(s) at selected locations may allow a user to define the amount of inductance that t-coil 106 provides.

Figure 2:
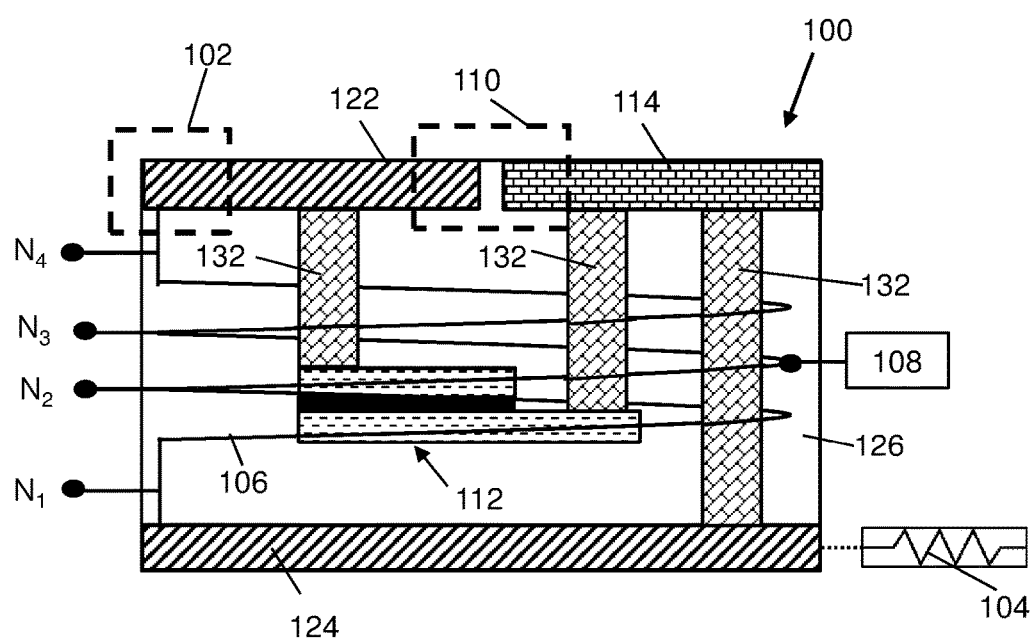
FIG. 2 shows a cross-sectional view of a device with an adjustable capacitor and inductor with two conductive layers according to embodiments of the structure.

Structure 100 may include a variable capacitor 112 coupled between input and output nodes 102, 104 to provide electrical compensation and tunability for t-coil 106 in structure 100. Variable capacitor 112 may be connected in parallel with t-coil 106 and parasitic capacitance(s) 110. Variable capacitor 112 may be configured to at least partially compensate for the presence of parasitic capacitance(s) 110. As discussed elsewhere herein, variable capacitor may provide further adjustability and control over the tuning of structure 100 to increase signal accuracy. The arrows superimposed on variable inductors 107 of t-coil 106 and variable capacitor(s) 112 on FIG. 1 denote the user-adjustability of these elements in structure 100. Variable capacitor 112 may be positioned within a single metal level of a device, or between two metal levels of a device. Additionally, variable capacitor 112 may be physically proximate or horizontally enclosed by t-coil 106. Thus, t-coil 106 may include a plurality of physical turns as shown in FIG. 2, such that variable capacitor(s) 112 is/are positioned within the inner horizontal perimeter of one of the plurality of turns. Variable capacitor 112 may include, e.g., a metal-insulator-metal (MIM) capacitor and/or vertical natural capacitor to occupy less space than other types of variable capacitors, while providing sufficient capacitance to compensate for changes in the inductance of t-coil 106. Examples shapes of variable capacitor(s) 112 are shown FIGS. 2-3 and discussed elsewhere herein.

A variable resistor 114 may be electrically coupled in series between variable capacitor 112 and output node 104 to provide a resistive-capacitive (RC) circuit element. Variable resistor 114 may take the form of any currently known or later developed instrument for providing a user-selected electrical resistance, e.g., a rheostat, analog potentiometer, digital potentiometer, membrane potentiometer, etc. The combination of variable capacitor 112 and variable resistor 114 may filter signals transmitted through structure 100.

FIG. 2 provides a cross-sectional view of a back end of line (BEOL) region of a device including structure 100. BEOL regions may also be known as a set of metallization layers. Structure 100 may include, e.g., a first conductive layer 122 for transmitting current through a portion of a device. First conductive layer 122 may include a metal wire for electrically connecting portions of a device to each other, and portions of variable resistor 114 as discussed herein with respect to the schematic view of structure 100. As examples, first conductive layer 122 may include copper (Cu), aluminum (Al), gold (Au), etc. Structure 100 may also include a second conductive layer 124 vertically separated form first conductive layer 122 and configured to electrically connect different elements of a device to each other. Conductive layers 122, 124 may be directly adjacent conductive layers of a particular device, or may be separated by one or more additional, intervening conductive layers. In any case, a portion of first conductive layer 102 may include or define input node 102 of structure 100, while second conductive layer 124 is electrically coupled to the load resistance at output node 104.

Figure 6:
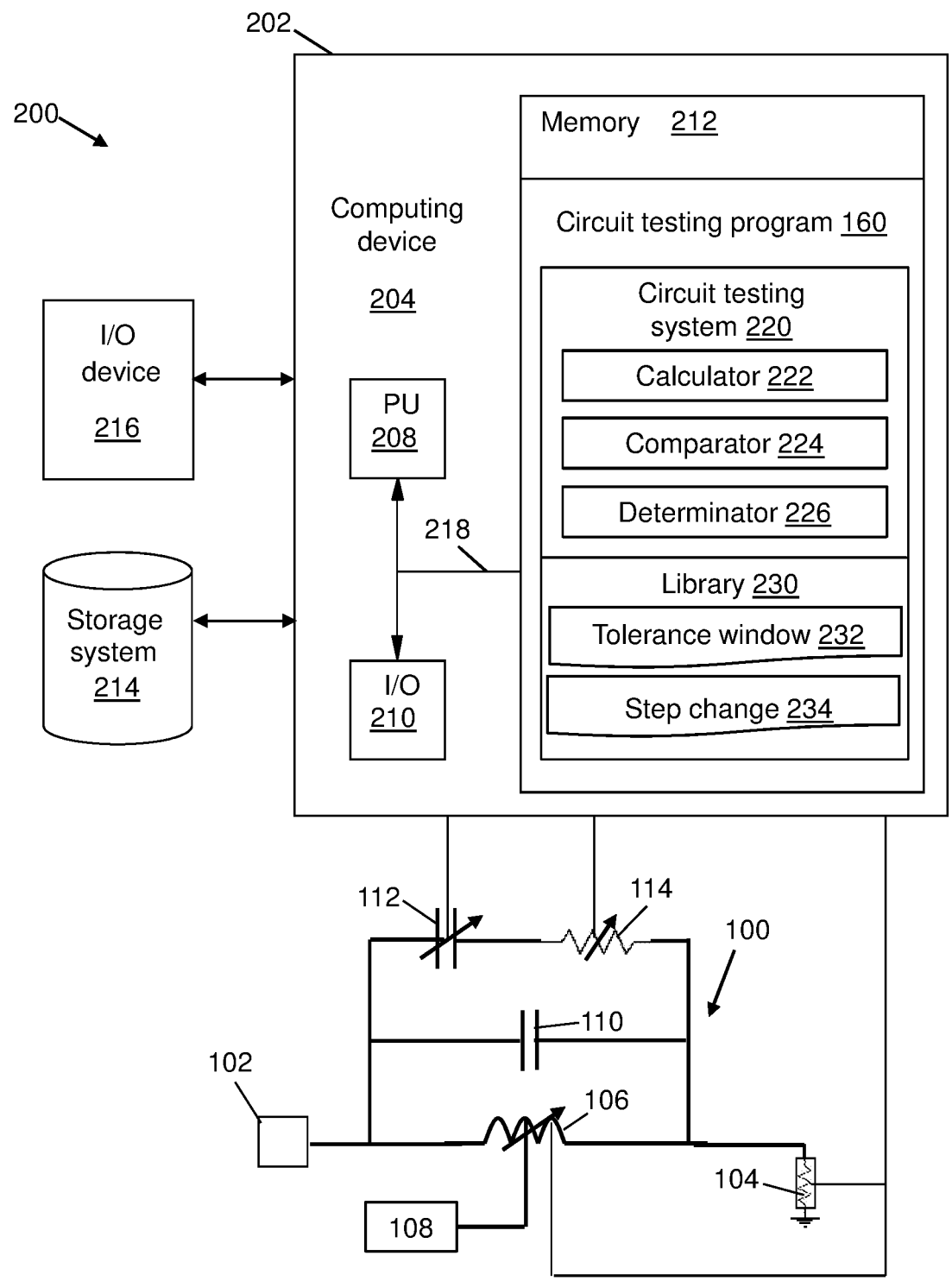
FIG. 6 depicts an illustrative environment, which includes a computer system configured to interact with an IC structure according to embodiments of the disclosure.

A dielectric material 126 may physically separate portions of each conductive layer 122, 124 from each other. Dielectric material 126 may include, for example, silicon dioxide ($SiO_2$), silicon nitride (SiN), silicon oxycarbide (SiCO), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), other silicon and nitride-based materials (e.g., SiBCN, SiNC, SiNOC), organosilicon compounds, and other currently known or later-developed materials having similar properties. Dielectric material 126 may be positioned between two closely-positioned conductive structures. In one example, dielectric material 126 is located between portions of first conductive layer 122, thereby forming parasitic capacitance(s) 110 as discussed elsewhere herein. Additional elements may be embedded in dielectric material 126, e.g., between conductive layers 122, 124, or alternatively as shown in FIG. 6 and discussed elsewhere herein, to electrically counteract the effects parasitic capacitance(s) 110 on signal transmission through output node 104.

Structure 100 may include t-coil 106, which in this example depiction includes vertically-oriented solenoid extending through dielectric material 126 between the first and second conductive layers 122, 124. As noted elsewhere herein, t-coil 106 may be electrically connected to ESD 108 at a center tap of the inductive wire within t-coil 106. ESD 108 may include a series of bypass nodes $N_1$, $N_2$, $N_3$, $N_4$ for dividing t-coil 106 into multiple segments connected to each other in series. Each node $N_1$, $N_2$, $N_3$, $N_4$ may be coupled, e.g., to a respective bypass transistor (e.g., inductor-bypassing transistor(s) 156 of FIG. 5) for adjusting the inductance of t-coil 106 and its variable inductors 107 during operation. Thus, electrical current may flow from first conductive layer 122 to second conductive layer 124 through t-coil 106. Structure 100 may also include several vias 132 within dielectric material 126 connecting layers 122, 124 to each other and to additional components located therebetween. A via refers to a vertically-oriented conductive region for connecting different layers of a structure to each other, which may be formed from the same conductive material(s) as layers 122, 124 or a different conductive material. Vias 132 are depicted with different cross-hatching solely for clarity of illustration.

Variable capacitor 112 may be positioned in close proximity to t-coil 106. Variable capacitor 112 may be positioned vertically between layers 122, 124. Vias 132 may electrically connect first conductive layer 122, through variable capacitor 112, to second conductive layer 124. Although FIG. 2 shows one terminal of variable capacitor 112 being connected to second conductive layer 124 partially through a metal wire within first conductive layer 122, this is not necessarily true in all instances. Variable capacitor 112 may be embodied as a MIM capacitor structure as noted elsewhere herein. A MIM capacitor structure refers to a capacitor structure in which two oppositely-charged layers of thin metal are separated from each other solely by a thin layer of dielectric. The capacitance of variable capacitor 112 may be adjustable, e.g., by including multiple variable capacitors 112 between layers 122, 124 and electrically in parallel with each other, and using a set of transistors to add capacitors to, or subtract capacitors from, the circuit between layers 122, 124. In any case, variable capacitor 112 may be positioned horizontally within the interior of t-coil 106 to provide electrical tuning while conserving space. It is therefore understood that variable capacitor 112 may be one of several variable capacitors each positioned within the surface area of t-coil 106.

Figure 3:
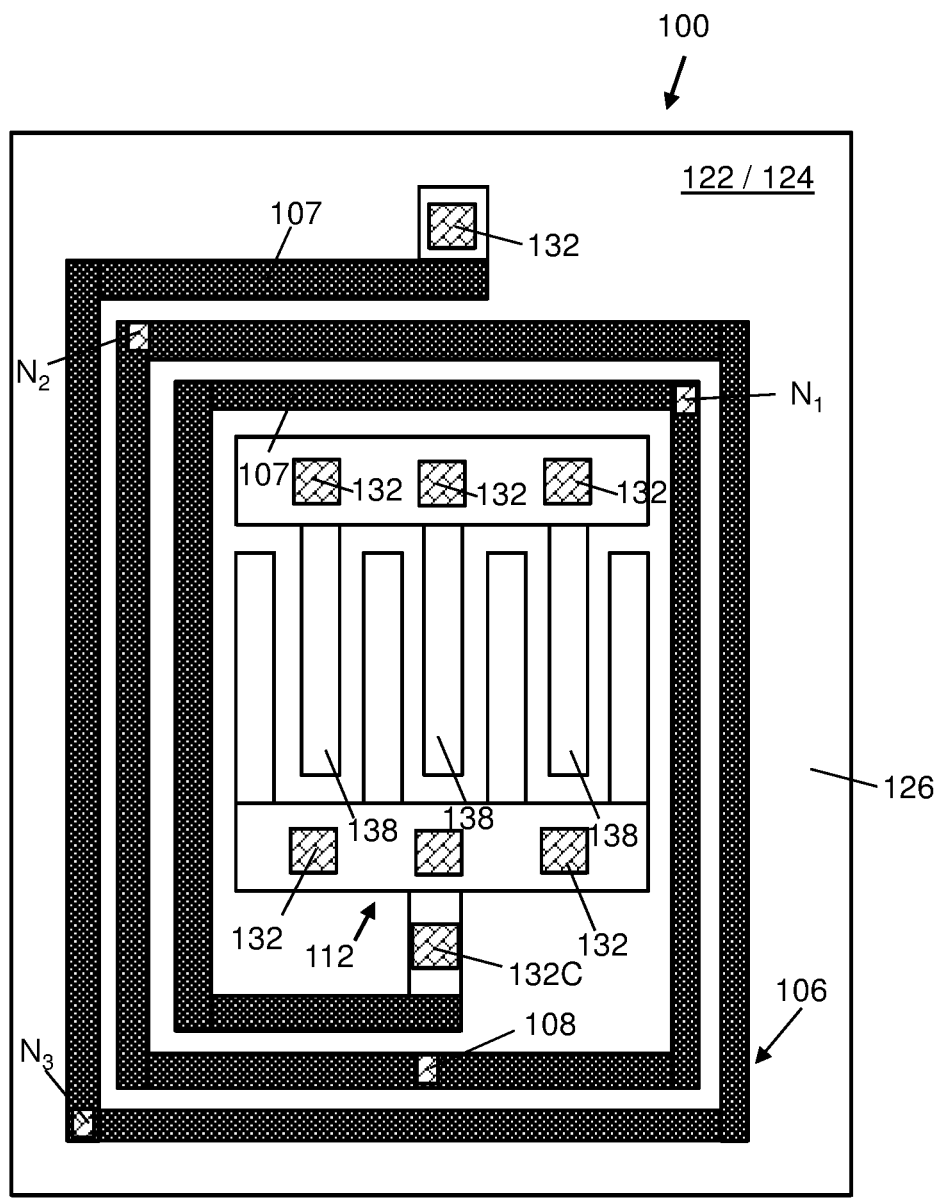
FIG. 3 shows a plan view of a spiral inductor and vertical natural capacitor in a single conductive layer according to embodiments of the disclosure.

Referring to FIG. 3 structure 100 may include variable capacitor 112 with a different capacitor structure positioned within conductive layer(s) 122, 124. FIG. 3 illustrates t-coil 106 and variable capacitor 112 of structure 100. According to an example, variable capacitor 112 may be positioned entirely within one conductive layer 122, 124. Rather than taking the form of a MIM capacitor as discussed elsewhere herein, variable capacitor 112 may be embodied as one or more vertical natural capacitors. Vertical natural capacitors operate on a similar principle to other capacitors, i.e., providing two conductive materials separated by a thin region of dielectric material 126 as discussed elsewhere herein. The capacitance of variable capacitor 112, whether embodied as a set of MIM capacitors or vertical natural capacitors, may be adjustable using capacitance-adjusting transistors to the control the number of active capacitors in structure 100 as discussed elsewhere wherein.

As shown in the example depiction in FIG. 3, variable capacitor 112 may include several interdigitated metal wires 138 each positioned within a single conductive layer 122, 124. In this case, the single conductive layer may be first conductive layer 122 or second conductive layer 124. Each interdigitated metal wire 138 may be laterally separated from another interdigitated metal wire 138 by a portion of dielectric material 126. Furthermore, variable capacitor 112 may include several groups of interdigitated metal wires 138, each vertically separated from each other by portions of dielectric material 126. In some cases, variable capacitor 112 may include several layers of interdigitated metal wires 138 each separated by a thin layer of dielectric material 126 to provide additional capacitance. In this arrangement, each pair of interdigitated metal wires 138 may act as an independent capacitor coupled in parallel with other interdigitated metal wires 138. To adjust the capacitance of variable capacitor 112, several vias 132 may connect different metal layers to each other through respective transistors for enabling or disabling current flow between portions of the capacitor structure. Thus, an operator can control whether current will flow through interdigitated metal wires 138 of variable capacitor 112, or bypass portions of variable capacitor 112 to provide a reduced capacitance.

With continued reference to the example of FIG. 3, t-coil 106 may also take the form of a spiral inductor positioned entirely within one conductive layer 122, 124. In this example, t-coil 106 generates a magnetic field by looping horizontally around itself within one conductive layer 122, 124. As with previously-discussed examples, t-coil 106 may include several nodes $N_1$, $N_2$, $N_3$, each of which may be coupled to a respective transistor for varying the total inductance of t-coil 106. As shown, one via 132C electrically connect to t-coil 106 in parallel with variable capacitor 112 within one conductive layer 122, 124. As also shown in FIG. 3, variable capacitor 112 and variable resistor 114 may be positioned entirely within the horizontal interior of t-coil 106. The arrangement of FIG. 3 reduces the surface area of structure 100 as compared to conventional circuits for counteracting parasitic capacitances. Although spiral-shaped t-coil 106 and vertical natural-type variable capacitor 112 are shown together, this may not be true in all instances. It is understood that either type of t-coil 106 or variable capacitor 112 may be used separately and/or in combination with other inductor or capacitor architectures discussed herein.

Figure 4:
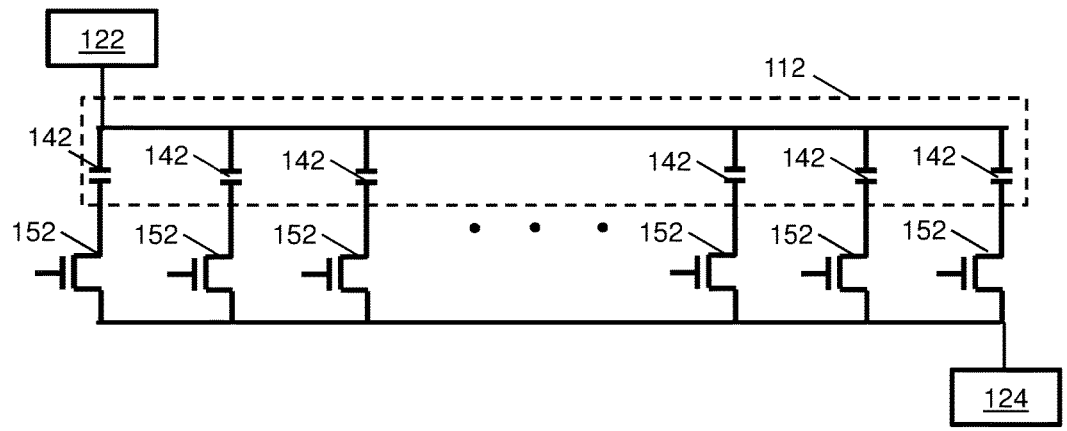
FIG. 4 shows a schematic view of a plurality of capacitors and transistors to provide an adjustable capacitance according to embodiments of the disclosure.

Referring briefly to FIG. 4, a schematic view of an example variable capacitor 112 is shown to demonstrate how the capacitance of variable capacitor 112 may be adjusted during operation. According to an embodiment, a plurality of fixed capacitors 142 may each be connected in parallel with each other. One terminal of each fixed capacitor 142 may be connected to first conductive layer 122 and another terminal of each fixed capacitor 142 is connected to second conductive layer 124. Six fixed capacitors 142 are shown solely for the sake of example, and any desired number of fixed capacitors 142 may be used as indicated by phantom lines. Each fixed capacitor 142 may have a non-adjustable capacitance. A plurality of capacitance-adjusting transistors 152 may each be positioned between one terminal of a respective fixed capacitor 142 and second conductive layer 124. Each capacitance-adjusting transistor 152 may include a gate terminal capable of enabling or disabling current flow across capacitance-adjusting transistor 152. A user may control, e.g., using a computer system communicatively coupled to structure 100, whether each capacitance-adjusting transistors 152 is turned on or off during operation. Enabling or disabling capacitance-adjusting transistors 152 will increase or decrease the equivalent capacitance of variable capacitor 112. Capacitance-adjusting transistors 152 may be turned on or off with the aid of a computing device as shown in FIG. 6 and discussed elsewhere herein.

Figure 5:
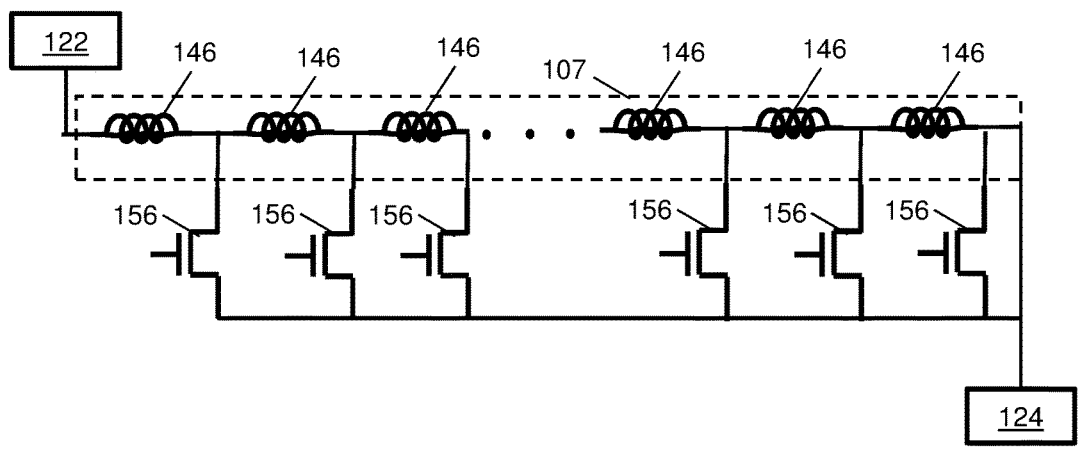
FIG. 5 shows a schematic view of a plurality of inductors and transistors to provide an adjustable capacitance according to embodiments of the disclosure.

Turning now to FIG. 5, a schematic view of one variable inductor 107 is shown according to an example embodiment, to also demonstrate how the inductance of variable inductor 107 may be adjusted during operation. Although the circuit architecture of FIG. 5 may be used to adjust the total equivalent inductance of variable inductor 107, other currently known or later developed solutions for providing an adjustable inductance may also be used. Variable inductor 107 may include a set of fixed inductors 146 each having two terminals to provide a series connection between conductive layers 122, 124. Six fixed inductors 146 are shown strictly as an example, and any number of fixed inductors 146 may be used as indicated by the corresponding phantom lines. Fixed inductors 146 may each define portions of one t-coil 106, having a first terminal at first conductive layer 122 and a second terminal at second conductive layer 124. A plurality of inductor-bypassing transistors 156 may connect one terminal of one fixed inductor 146 to second conductive layer 124. The gate of each inductor-bypassing transistor 156 may control whether electric current bypasses any or all remaining inductors when flowing from first conductive layer 122 to second conductive layer 124. During operation, a user may adjust the equivalent inductance of t-coil 106 by enabling or disabling current flow through each inductor-bypassing transistor 156. Enabling or disabling inductor-bypassing transistors 156 will add or subtract fixed inductors 146 from the current path through variable inductor 107. Inductor-bypassing transistors 156 may be turned on or off with the aid of a computing device as shown in FIG. 6 and discussed elsewhere herein.

Referring to FIG. 6, an illustrative environment 200 for implementing methods and/or systems of the disclosure is shown. In particular, a computer system 202 is shown to include a computing device 204. Computing device 204 may include a circuit testing program 160 which may include, e.g., one or more sub-systems (a circuit testing system 220, a library 230, etc., for performing any/all of the processes described herein and implementing any/all of the embodiments described herein. It is emphasized the environment 200 may be operable for testing structure 100 in a variety of contexts, e.g., before the time of manufacture. In this case, structure 100 may be provided as a circuit model within memory 212 of computing device 204. Methods according to the disclosure may be implemented on structure 100 in a modeled form to derive manufacturing settings to create structure 100. For example, the present disclosure may derive values of resistance, capacitance, and/or inductance for adjustable components based on test values, and thereby allow a user to manufacture structure 100 to have the derived values of resistance, capacitance, and/or inductance.

Computer system 202 is shown including a processing unit (PU) 208 (e.g., one or more processors), an I/O component 210, a memory 212 (e.g., a storage hierarchy), an external storage system 214, an input/output (I/O) device 216 (e.g., one or more I/O interfaces and/or devices), and a communications pathway 218. I/O component 210 and/or I/O device 216 may optionally include an oscilloscope and/or similar device for measuring and analyzing a signal for transmission at output node 104 of structure 100. In general, processing unit 208 may execute program code, such as circuit testing program 160, which is at least partially fixed in memory 212. While executing program code, processing unit 208 may process data, which may result in reading and/or writing data from/to memory 212 and/or storage system 214. Pathway 218 provides a communications link between each of the components in environment 200. I/O component 210 may include one or more human I/O devices, which enable a human user to interact with computer system 202 and/or one or more communications devices to enable a system user to communicate with the computer system 202 using any type of communications link. To this extent, circuit testing program 160 may manage a set of interfaces (e.g., graphical user interface(s), application program interface(s), etc.) that enable system users to interact with circuit testing program 160. Further, circuit testing program 160 may manage (e.g., store, retrieve, create, manipulate, organize, present, etc.) data, through several modules contained within a circuit testing system 220. Circuit testing system 220 is shown by example as being a sub-system of circuit testing program 160.

As noted herein, circuit testing program 160 may include a circuit testing system 220. In this case, modules 222, 224, 226, of circuit testing system 220 may enable computer system 202 to perform a set of tasks used by circuit testing program 160, and may be separately developed and/or implemented apart from other portions of circuit testing program 160. Calculator 222 can implement various mathematical computations in processes discussed herein. Comparator 224 can compare two quantities and/or items of data in processes discussed herein. Determinator 226 may, e.g., make logical determinations based on compliance or non-compliance with various conditions in processes discussed herein. One or more modules 222, 224, 226, may use algorithm-based calculations, look up tables, software code, and/or similar tools stored in memory 212 for processing, analyzing, and operating on data to perform their respective functions. Each module discussed herein may obtain and/or operate on data from exterior components, units, systems, etc., or from memory 212 of computing device 204.

Computing device 204 and/or circuit testing program 160 may also include a listing of data expressed as a library 230 which for storing information and/or parameters to operate and test structure 100. Library 230 may include an index of metrics for physical parameters to evaluate whether structure 100 complies with performance requirements for a particular component, product, system, etc. Library 230 may be subdivided into various data fields, e.g., two data fields as shown in FIG. 6. For instance, a tolerance window field 232 of library 230 may provide the minimum and/or maximum values of return loss (RL), signal bandwidth (BW), or other variables associated with signal processing. RL refers to the loss of power in a signal, which may be reflected by discontinuities or structural defects in a signal-transmitting medium (e.g., a fiber or wire). RL may be expressed as a ratio of signal output power to signal output power, e.g., in decibels (dB). BW refers to the upper and lower frequency limit of transmissible frequencies in a signal. BW may be expressed in gigahertz (GHz) as the difference between the highest possible frequency and lowest possible frequency over a signal spectrum. In some embodiments as discussed herein, structure 100 must be manufactured and/or adjusted to exhibit RL and/or BW levels that comply with values defined in tolerance window 232 for safe operation. Library 232 may also include a step change field 234 for recording one or more predetermined adjustments to the inductance of t-coil 106, capacitance of variable capacitor 112, resistance of variable resistor 114, and/or load resistor of output node 104 to apply under predetermined conditions as discussed elsewhere herein. For example, step change 234 may include a predetermined reduction in inductance, and/or increase in capacitance, that may be applied to components of structure 100 before or after the time of manufacture. Other rules and/or forms of reference measurements, values, etc., may additionally or alternatively be stored in different fields of library 230. Circuit testing system 220 and modules 222, 224, 226 thereof may cross-reference and apply data within library 230 to implement various processes according to the disclosure, e.g., adjusting t-coil 106, variable capacitor 112, variable resistor 114, etc., to compensate for parasitic capacitance 110.

Computer system 202 may be operatively connected to or otherwise in communication with portions of structure 100, whether provided as a physical device or a simulated model of structure 100 in memory 212. For example, computer system 202 may be communicatively coupled to adjustable circuit elements of structure 100 to vary return loss and bandwidth while compensating for parasitic capacitance 110. Specifically, adjustable elements of t-coil 106, variable capacitor 112 (e.g., transistors 152 (FIG. 4), 156 (FIG. 5), variable resistor 114, and optionally load resistor of output node 104, may be electrically coupled to computer system 202, e.g., through I/O component 210. Through this communicative connection, circuit testing system 220 may select different values of inductance, capacitance, and/or resistance, for varying the RL and BW of structure 100 to account for different types of signals and/or operating modes. As discussed herein, embodiments of the present disclosure may generate instructions, e.g., through I/O component 210 and/or I/O device 246 to manufacture and/or modify structure 100 in cases where the RL, BW and/or other characteristics violate tolerance window field 232, or to apply adjustments to structure 100 as defined in step change field 234.

Where computer system 202 includes multiple computing devices, each computing device may have only a portion of circuit testing program 160 and/or circuit testing system 220 (including, e.g., modules 222, 224, 226) fixed thereon. However, it is understood that computer system 202 and circuit testing system 220 are only representative of various possible equivalent computer systems that may perform a process described herein. Computer system 202 may obtain or provide data, such as data stored in memory 212 or storage system 214, using any solution. For example, computer system 202 may generate and/or be used to generate data from one or more data stores, receive data from another system, send data to another system, etc.

Figure 7:
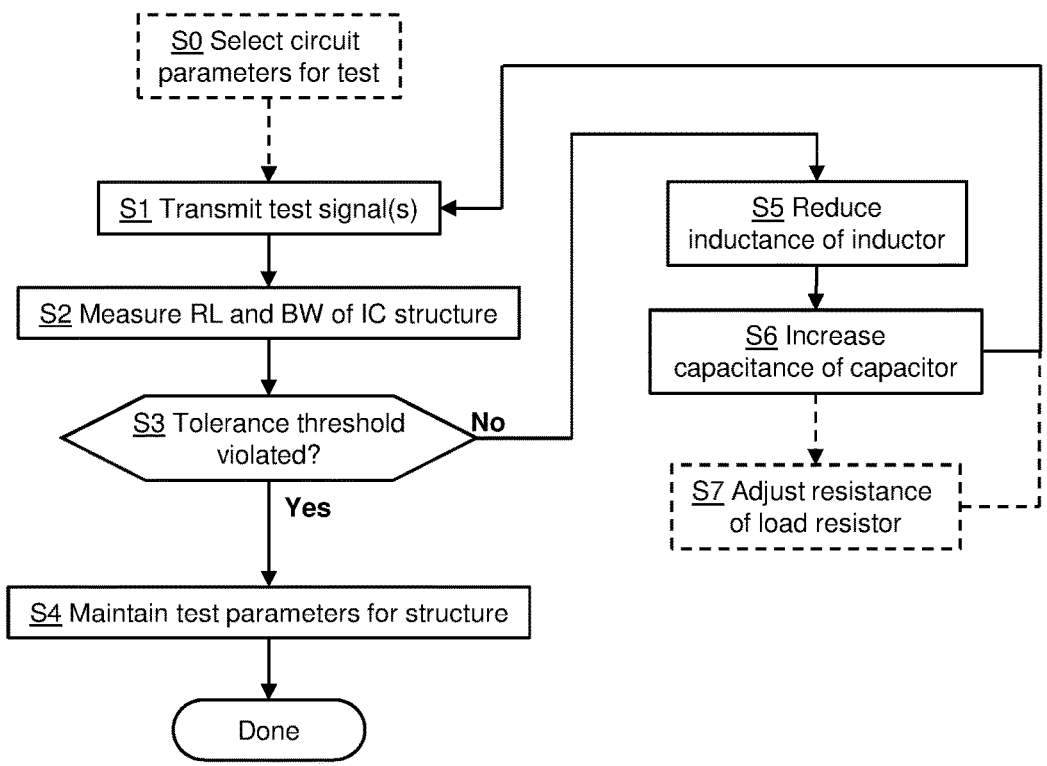
FIG. 7 shows an illustrative flow diagram for implementing a method for adjusting the inductance and capacitance of a structure according to embodiments of the disclosure.

Referring to FIGS. 6 and 7 together, illustrative processes are shown for automatically designing, adjusting, or otherwise configuring structure 100 for operation while maintaining operational variables (e.g., RL and/or BW). The steps and processes depicted in FIG. 7 may be implemented, e.g., with components of circuit testing program 160, one or more modules 222, 224, 226 of circuit testing system 220, and/or other components of computer system 202 described herein by example. Implementing the processes discussed herein may automatically compensate for parasitic capacitance 110, e.g., by adjusting t-coil 106, variable capacitor 112, and/or variable resistor 114 to comply with operational needs for structure 100, either before or after manufacture. It is understood that the present disclosure may be implemented with respect to multiple systems 100 simultaneously and/or sequentially, with each structure 100 having different amounts of parasitic capacitance 100 and/or different operational requirements specified in library 230. It is also understood that methods according to the disclosure may be implemented on a simulation of structure 100. In such cases, structure 100 may be manufactured to include selected inductances, capacitances, and/or resistances output from methods according to the disclosure. It is also understood that in further embodiments, some or all of steps S1-S7 may be implemented using special purpose hardware, e.g., an FPGA programmed to implement each of the various steps discussed herein. Other example implementations, alternatives, etc., are discussed herein where appropriate.

The process flow may begin with a preliminary step S0 of selecting initial test parameters for structure 100. Such parameters may include an initial inductance of t-coil 106, an initial capacitance of variable capacitor 112, and/or an initial resistance of variable resistor 114. In a more specific example, t-coil 106 may be initially set to its maximum inductance (e.g., by disabling all inductor-bypassing transistors 156 for each variable inductor 107 in the embodiment shown in FIG. 5) and variable capacitor 112 may initially be set to its minimum capacitance (e.g., by disabling all capacitance-adjusting transistors 152 in the embodiment shown in FIG. 4). As will be discussed with respect to other steps, it may be possible to compensate for parasitic capacitance 110 with a lower amount of inductance or a higher amount of capacitance while persevering acceptable levels of return loss (RL) and/or bandwidth (BW) in structure 100.

Proceeding to step S1, methods according to the disclosure may include transmitting a test signal through structure 100, e.g., as an actual test signal on an existing structure 100 or as a simulated test signal through a model of structure 100. In either case, test signals may be provided to structure 100 at input node 102. The transmitting of a test signal at step S1 may include, e.g., coupling input node 102 (including, e.g., first conductive layer 122 (FIGS. 2, 3)) as discussed elsewhere herein. The test signal to be transmitted at step S1 may be susceptible to RL and/or reductions in BW due to the existence of parasitic capacitance(s) 110 in structure 100. T-coil 106, variable capacitor 112, and/or variable resistor 114 may be configured to compensate for such losses, but the presence of these components may increase the power consumption of structure 100 and/or introduce other electrical losses. Thus, a circuit designer may want to operate structure 100 with a minimum amount of inductance in t-coil 106, with an increased amount of capacitance in variable capacitor 112, and/or with a predetermined resistance of variable resistor 114. Subsequent process steps evaluate the performance of structure 100 as test signals are transmitted therethrough, e.g., to determine whether t-coil 106, variable capacitor 112, and/or variable resistor 114, in a simulated or physical form, may be adjusted while maintaining performance requirements.

Continuing to step S2, embodiments of the disclosure may include measuring the RL and BW of structure 100 at output node 104 for the test signal transmitted through structure 100 in step S1. Measuring RL and BW may include, e.g., using I/O component 210 and/or device 216 to convert the signal at output node 104 to a waveform representation. The amplitude, frequency, and/or other attributes of the signal may then be derived from the representative waveform using calculator 222 of circuit testing system 220. RL may be expressed as a value of dB and BW may be expressed in terms of GHz as discussed above.

Proceeding to step S3, embodiments of the disclosure may include using comparator 224 to compare the measured RL and BW with tolerance threshold values (e.g., in field 232). The comparison in step S3 may indicate whether it is possible to adjust t-coil 106 and variable capacitor 112 without risking non-compliance with specifications for structure 100. It is noted that compliance or non-compliance with values in tolerance threshold field 234 need not be the same as compliance or non-compliance with specification requirements for structure 100. Specifically, tolerance threshold field 234 may simply indicate whether adjusting t-coil 106 and/or capacitor 112 risks bringing the RL and BW to a level that differs from other requirements of structure 100 by too small an amount. Where the comparison indicates that the tolerance threshold is violated at output node 104 (i.e., "Yes" at step S3) the method may continue to step S4 of maintaining the test parameters of structure 100 during operation, and without further modification. The maintaining in step S4 may include or precede manufacturing structure 100 to include the test parameters for each component. The method may then conclude ("Done"), such that structure 100 will operate with the maintained values of inductance for t-coil 106 and the maintained values of capacitance for variable capacitor 112.

Alternatively, the comparing in step S3 may indicate that the tolerance threshold for structure 100 is not violated (i.e., "No" at step S3). In this case, circuit testing program 160 may perform further actions to reduce the amount that t-coil 106 and variable capacitor 112 compensate for parasitic capacitance(s) 110. Proceeding to step S5, circuit testing system 220 may refer to step change field 232 to reduce the inductance of t-coil 106. Reducing inductance may include, e.g., activating one or more inductor-bypassing transistors 156 (FIG. 5) as noted elsewhere herein. Proceeding from step S5, the method may further include increasing the capacitance of variable capacitor 112 by a particular amount in step S6. The increased amount of capacitance may also be defined, e.g., in step change field 234. Increasing the capacitance of variable capacitor in step S6 may optionally include activating one or more capacitance-adjusting transistors 152 (FIG. 4) after manufacture, adjusting the number of variable capacitors 112 included in structure 100, and/or other steps as discussed elsewhere herein. The method may then return to step S1, where circuit testing program 160 transmits a new test signal through structure 100 before measuring RL and BW for structure 100 with the adjusted inductance and capacitance. The method may then repeat in a looping fashion until step S3 indicates that the selected inductance and capacitance cause structure 100 to violate the tolerance threshold (i.e., "Yes" at step S3).

In further embodiments, it is possible to adjust additional elements of structure 100. Specifically, the method may include an additional step S7 of adjusting the resistance of variable resistor 114. Adjusting the resistance in step S7 may accompany the steps for adjusting inductance and capacitance in steps S5, S6, and in alternative configurations may occur before or during steps S5, S6. Where possible and/or applicable, a circuit operator may increase or decrease the load resistance to further reduce electrical losses in structure 100. The process flow may then return to step S1 of transmitting another test signal as discussed elsewhere herein.

Figure 8:
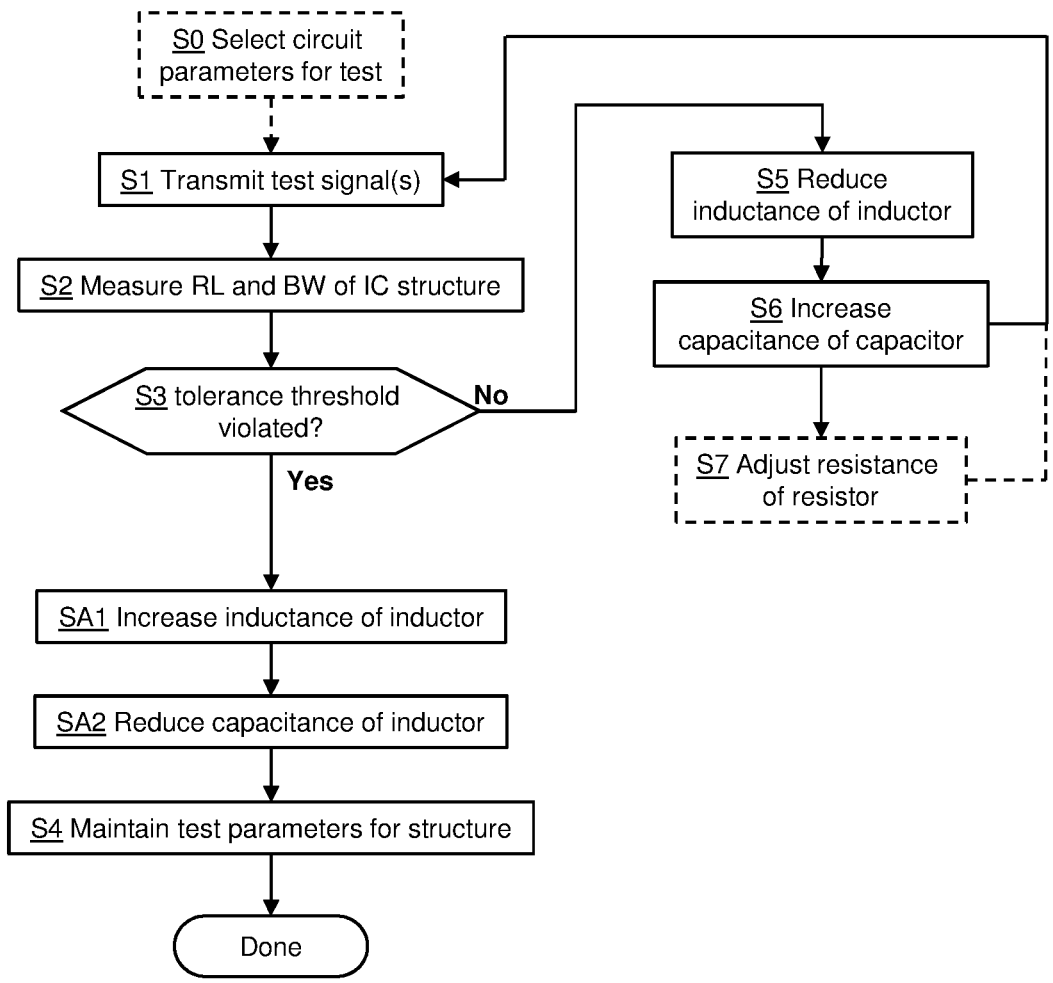
FIG. 8 shows an illustrative flow diagram for implementing a method for adjusting the inductance and capacitance of a structure according to further embodiments of the disclosure.

Referring to FIG. 8, further embodiments of the disclosure may optionally include additional steps for further modifying structure 100 when the tolerance threshold is violated. Specifically, embodiments of the disclosure may include two additional intervening steps SA1, SA2 for compensating for non-compliance with the tolerance threshold in step S3. A circuit operator may wish to perform steps SA1, SA2 in cases where non-compliance with the tolerance threshold may also violate minimum operating conditions for structure 100. At step SA1, an operator may increase the inductance of t-coil 106, e.g., by an amount specified in step change field 232 or a different amount. Increasing the inductance of t-coil 106, in some cases, may reverse a prior reduction to inductance in step S5. At step SA2, an operator may decrease the capacitance of variable capacitor 112, e.g., by an amount specified in step change field 232 or a different amount. Decreasing the capacitance of variable capacitor 112, in some cases, may reverse a prior increase to capacitance in step S6. Optional steps SA1, SA2 may also include enabling or disabling current flow through transistors 152 (FIG. 4), 156 (FIG. 6) as noted elsewhere herein. The method may then continue by maintaining the test parameters for structure 100, manufacturing structure 100 to include the maintained test parameters, etc., after applying the adjustments in step SA1, SA2. The method may then conclude ("Done") as noted elsewhere herein.

Figure 9:
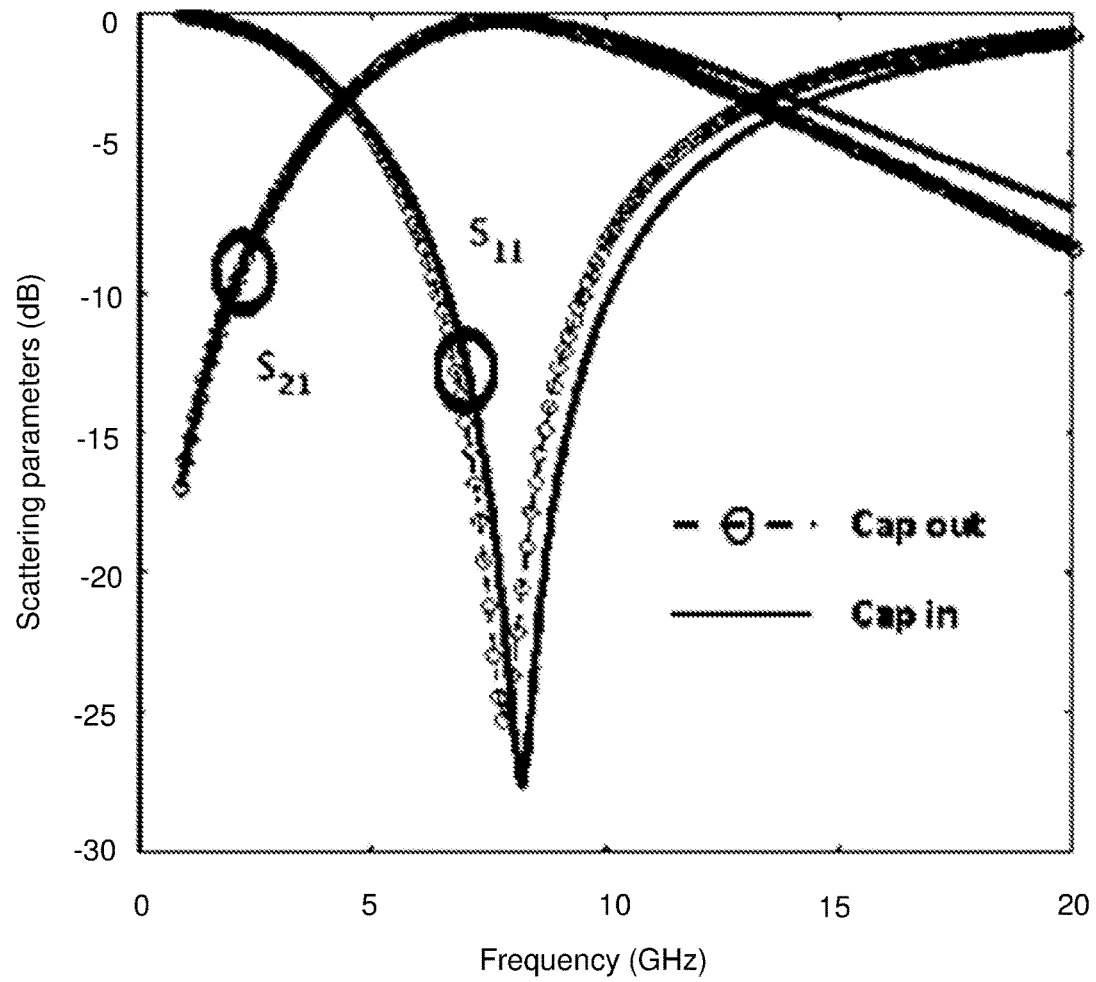
FIG. 9 shows a graphical plot of scattering (S) parameters versus frequency comparing a structure with a variable capacitor against a structure without a variable capacitor.

Embodiments of the disclosure may provide several technical and commercial advantages, some of which are discussed herein by way of example. One technical advantage of the disclosure is shown in FIG. 9. FIG. 9 shows a plot of scattering parameters (in dB) versus signal frequency (in GHz) for an amplifier circuit which includes variable capacitor 112 (FIGS. 1-3, 6), in contrast a conventional circuit structure. Solid trend lines in FIG. 9 correspond to embodiments of structure 100, while phantom lines represent the performance of conventional structures without variable capacitor 112 included. Embodiments of structure 100 may include variable capacitor 112 (FIGS. 1-3, 6) within the inner perimeter of t-coil 106 (FIGS. 1-3, 6), and thus occupy a smaller amount of surface area than conventional structures for counteracting a parasitic capacitance. A first curve $S_{11}$, comparing return loss (RL) between structure 100 and conventional structures, indicates that positioning variable capacitor 112 does not significantly alter the performance of structure 100 despite the substantial reduction in surface area. Similarly, a second curve $S_{21}$ indicative of bandwidth (BW) demonstrates that including variable capacitor 112 in structure 100 will maintain the full signal transmission bandwidth without reductions.

Conventional design methodologies would otherwise suggest that placing t-coil 106 and variable capacitor 112 in close proximity would impede the performance of both components. The plot of FIG. 9 thus demonstrates that placing t-coil 106 and variable capacitor 112 in close proximity with each other will not impede the ability to test and adjust structure 100. Additionally, as noted above, methods according to the disclosure may reduce the amount of inductance introduced to structure 100 for offsetting parasitic capacitance 112. Including t-coil 106 and variable capacitor 112 with adjustable attributes within structure 100 reduces the surface area of elements for offsetting a parasitic capacitance in a circuit.

Figure 10:
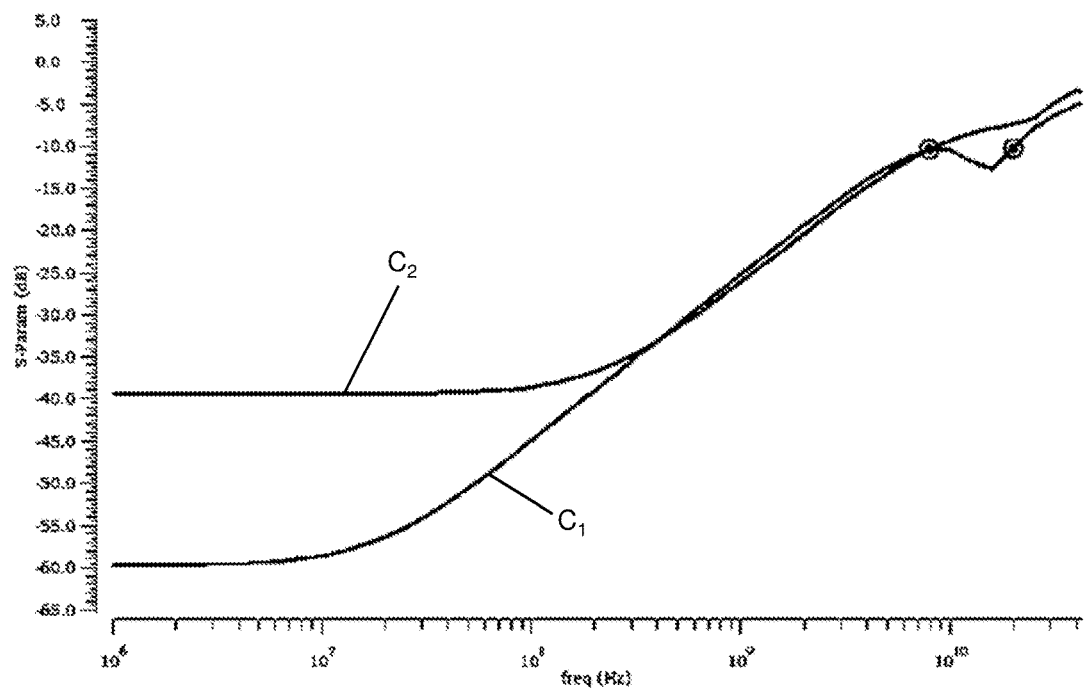
FIG. 10 shows a graphical plot of scattering (S) parameters for return loss (RL) bandwidth comparing a structure with a t-coil against a structure without a t-coil.

FIG. 10 provides a comparative plot of scattering parameters versus frequency to illustrate return loss for two differently-sized t-coils 106. A first curve $C_1$ illustrates RL bandwidth over varying signal parameters (e.g., amplitudes) for a t-coil having a diameter of approximately sixty µm, while second curve $C_2$ illustrates RL bandwidth for embodiments of structure 100 with a smaller t-coil having a diameter of approximately forty µm. Despite this reduction in size, structure 100 represented in first curve $C_2$ is shown to have a greatly increased RL bandwidth at higher frequencies as compared to the structure of first curve $C_1$. An example comparison in performance may be, e.g., an RL bandwidth of approximately 20 GHz in second curve $C_2$ as compared to an RL bandwidth of approximately 8.0 GHz in first curve $C_1$ for a conventional circuit.

As will be appreciated by one skilled in the art, aspects of the present disclosure may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having computer readable program code embodied thereon.

Any combination of one or more computer readable medium(s) may be used. A computer readable storage medium may be, for example, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that may contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that may direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the Figures illustrate the layout, functionality, and operation of possible implementations of systems, methods and computer program products according to various embodiments of the present invention. In this regard, each block in the flowchart or block diagrams may represent a module, segment, or portion of code, which includes one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, may be implemented by special purpose hardware-based systems that perform the specified functions or acts, or combinations of special purpose hardware and computer instructions.

As used herein, the term "configured," "configured to" and/or "configured for" may refer to specific-purpose patterns of the component so described. For example, a system or device configured to perform a function may include a computer system or computing device programmed or otherwise modified to perform that specific function. In other cases, program code stored on a computer-readable medium (e.g., storage medium), may be configured to cause at least one computing device to perform functions when that program code is executed on that computing device. In these cases, the arrangement of the program code triggers specific functions in the computing device upon execution. In other examples, a device configured to interact with and/or act upon other components may be specifically shaped and/or designed to effectively interact with and/or act upon those components. In some such circumstances, the device is configured to interact with another component because at least a portion of its shape complements at least a portion of the shape of that other component. In some circumstances, at least a portion of the device is sized to interact with at least a portion of that other component. The physical relationship (e.g., complementary, size-coincident, etc.) between the device and the other component may aid in performing a function, for example, displacement of one or more of the device or other component, engagement of one or more of the device or other component, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit (IC) structure comprising:
   a first conductive layer of a device structure;
   a second conductive layer of the device structure vertically separated from the first conductive layer, wherein a load resistor couples the second conductive layer to ground;
   a t-coil having a first end coupled to the first conductive layer, and a second end coupled to the second conductive layer; and
   a variable capacitor having a first end coupled to the first conductive layer, and a second end coupled to the second conductive layer, the variable capacitor having an adjustable capacitance.

2. The IC structure of claim 1, wherein the variable capacitor includes a metal-insulator-metal (MIM) capacitor positioned entirely between the first and second conductive layers of the device structure.

3. The IC structure of claim 1, wherein the variable capacitor includes a vertical natural capacitor (VNCAP) having a plurality of interdigitated metal wires entirely within the first or second conductive layer of the device structure.

4. The IC structure of claim 1, wherein the t-coil comprises one of a spiral inductor or a solenoid inductor positioned entirely between the first and second conductive layers of the device structure.

5. The IC structure of claim 1, wherein the load resistor is positioned in one of a front end of line (FEOL) layer or a back end of line (BEOL) layer of the device structure.

6. The IC structure of claim 1, wherein the t-coil comprises:
   a plurality of fixed inductors electrically connected in series between the first and second conductive layers of the device structure; and
   at least one inductor-bypassing transistor coupled between the first conductive layer and a junction between two of the plurality of fixed inductors, wherein the at least one inductor-bypassing transistor selectively permits an electrical current to bypass at least one of the plurality of fixed inductors.

7. The circuit structure of claim 1, wherein the variable capacitor comprises:
   a plurality of fixed capacitors electrically connected in parallel between the first and second conductive layers of the device structure, each of the plurality of fixed capacitors including a positive terminal and a negative terminal; and
   at least one capacitance-adjusting transistor coupled between the positive terminals of two of the plurality of fixed capacitors, wherein the at least one capacitance-adjusting transistor selectively enables a parallel current flow across at least one of the plurality of fixed capacitors.

8. The circuit structure of claim 1, wherein the t-coil comprises a plurality of turns each having an inner horizontal perimeter, wherein the variable capacitor is positioned entirely within the inner horizontal perimeter of one of the plurality of turns.

9. The circuit structure of claim 1, further comprising a parasitic capacitance coupled between the input node and the output node in parallel with the t-coil and the variable capacitor.

10. An integrated circuit (IC) structure comprising:
    a first conductive layer of a device structure coupled to a transmission line;
    a second conductive layer of the device structure separate from the first conductive layer, wherein a load resistor couples the second conductive layer to ground;
    a parasitic capacitance coupled between the first conductive layer and the second conductive layer;
    a t-coil having a first end coupled to the first conductive layer, and a second end coupled to the second conductive layer, the t-coil including a plurality of turns each having an inner horizontal perimeter; and
    a variable capacitor having a first end coupled to the first conductive layer, and a second end coupled to the second conductive layer through a variable resistor, the variable capacitor having an adjustable capacitance, wherein the variable capacitor is positioned entirely within the inner horizontal perimeter of one of the plurality of turns of the t-coil.

11. The IC structure of claim 10, wherein the t-coil comprises:
    a plurality of fixed inductors electrically connected in series between the first and second conductive layers of the device structure; and
    at least one inductor-bypassing transistor coupled between the first conductive layer and a junction between two of the plurality of fixed inductors, wherein the at least one inductor-bypassing transistor selectively permits an electrical current to bypass at least one of the plurality of fixed inductors.

12. The IC structure of claim 11, wherein the variable capacitor comprises:
    a plurality of fixed capacitors electrically connected in parallel between the first and second conductive layers of the device structure, each of the plurality of fixed capacitors including a positive terminal and a negative terminal; and
    at least one capacitance-adjusting transistor coupled between the positive terminals of two of the plurality of fixed capacitors, wherein the at least one capacitance-adjusting transistor selectively enables a parallel current flow across at least one of the plurality of fixed capacitors.

13. The IC structure of claim 10, wherein the variable capacitor includes a metal-insulator-metal (MIM) capacitor positioned entirely between the first and second conductive layers of the device structure.

14. The IC structure of claim 10, wherein the variable capacitor includes a vertical natural capacitor (VNCAP) having a plurality of interdigitated metal wires entirely within the first or second conductive layer of the device structure.

15. A method comprising:
    providing an integrated circuit (IC) structure including:
    a first conductive layer of a device structure,
    a second conductive layer of the device structure vertically separated from the first conductive layer, wherein a load resistor couples the second conductive layer to ground,
    a t-coil having a first end coupled to the first conductive layer, and a second end coupled to the second conductive layer, and
    a variable capacitor having a first end coupled to the first conductive layer, and a second end coupled to the second conductive layer through a variable resistor, the variable capacitor having an adjustable capacitance, wherein the variable capacitor is electrically coupled in parallel with the t-coil between the input and output nodes, and wherein the t-coil and the variable capacitor are each positioned between the first and second conductive layers of the IC structure;

measuring a return loss (RL) and bandwidth (BW) of the IC structure by transmitting a test signal from the input node to the output node, the t-coil having a test inductance and the variable capacitor having a test capacitance for the test signal;

in response to the RL and BW meeting a tolerance threshold of the IC structure, reducing the test inductance of the t-coil and increasing the test capacitance of the variable capacitor by a predetermined amount; and in response to the RL and BW violating the tolerance threshold of the IC structure, maintaining the test inductance of the t-coil and the test capacitance of the variable capacitor.

16. The method of claim 15, further comprising, in response to the RL and BW violating the specification of the circuit structure, adjusting a resistance of the variable resistor in addition to the adjustable inductance of the t-coil or the adjustable capacitance of the variable capacitor.

17. The method of claim 15, wherein the variable capacitor comprises a plurality of fixed capacitors each coupled in parallel to the input node at a respective capacitance-adjusting transistor, wherein increasing the adjustable capacitance of the variable capacitor includes enabling current flow through an additional one of the plurality of fixed capacitors than previously enabled.

18. The method of claim 15, wherein the t-coil comprises a plurality of fixed inductors each coupled in series between the input and output nodes, each inductor being coupled to a respective inductor-bypass transistor, wherein reducing the adjustable inductance of the t-coil includes disabling current flow through an additional one of the plurality of fixed inductors than previously enabled.

19. The method of claim 15, wherein the provided IC structure further includes a parasitic capacitance coupled between the input node and the output node in parallel with the t-coil and the variable capacitor.

20. The method of claim 15, further comprising in response to the RL and BW violating the tolerance threshold of the IC structure, increasing the adjustable inductance of the t-coil from the previous test inductance and decreasing the adjustable capacitance of the variable capacitor from the previous test capacitance before maintaining the test inductance of the t-coil and the test capacitance of the variable capacitor.

* * * * *